United States Patent
Inazu

(10) Patent No.: US 11,605,753 B2
(45) Date of Patent: Mar. 14, 2023

(54) SEMICONDUCTOR LIGHT-EMITTING ELEMENT

(71) Applicant: NIKKISO CO., LTD., Tokyo (JP)

(72) Inventor: Tetsu Hiko Inazu, Hakusan (JP)

(73) Assignee: NIKKISO CO., LTD., Tokyo (JP)

( * ) Notice: Subject to any disclaimer, the term of this patent is extended or adjusted under 35 U.S.C. 154(b) by 70 days.

(21) Appl. No.: 17/369,493

(22) Filed: Jul. 7, 2021

(65) Prior Publication Data

US 2022/0336693 A1   Oct. 20, 2022

(30) Foreign Application Priority Data

Apr. 15, 2021 (JP) .............................. JP2021-069026

(51) Int. Cl.
*H01L 33/32* (2010.01)
*H01L 33/06* (2010.01)
*H01L 33/00* (2010.01)

(52) U.S. Cl.
CPC .......... *H01L 33/0025* (2013.01); *H01L 33/06* (2013.01); *H01L 33/32* (2013.01)

(58) Field of Classification Search
CPC ...... H01L 33/0025; H01L 33/06; H01L 33/32
See application file for complete search history.

(56) References Cited

U.S. PATENT DOCUMENTS

| | | | | |
|---|---|---|---|---|
| 2010/0044674 | A1* | 2/2010 | Kim | H01L 33/04 257/14 |
| 2012/0037881 | A1* | 2/2012 | Kim | H01L 33/0025 438/45 |
| 2015/0333218 | A1* | 11/2015 | Han | H01L 33/0025 257/13 |
| 2017/0213936 | A1* | 7/2017 | Nagata | H01L 33/24 |

FOREIGN PATENT DOCUMENTS

JP          2013183126 A       9/2013

* cited by examiner

*Primary Examiner* — Mark W Tornow
(74) *Attorney, Agent, or Firm* — Muncy, Geissler, Olds & Lowe, P.C.

(57) ABSTRACT

A semiconductor light-emitting element includes: an n-type contact layer; an n-side inserted layer provided on a first upper surface of the n-type contact layer, made of an AlGaN-based semiconductor material, and having a thickness equal to or smaller than 5 nm; an n-type clad layer provided on the n-side inserted layer; an active layer provided on the n-type clad layer and including a well layer and a barrier layer made of an AlGaN-based semiconductor material; a p-type clad layer provided on the active layer; a p-side inserted layer provided on the p-type clad layer, made of an AlGaN-based semiconductor material, and having a thickness equal to or smaller than 5 nm; and a p-type contact layer provided on the p-side inserted layer. An AlN composition of each of the n-side and p-side inserted layers is higher than an AlN composition of the barrier layer.

6 Claims, 1 Drawing Sheet

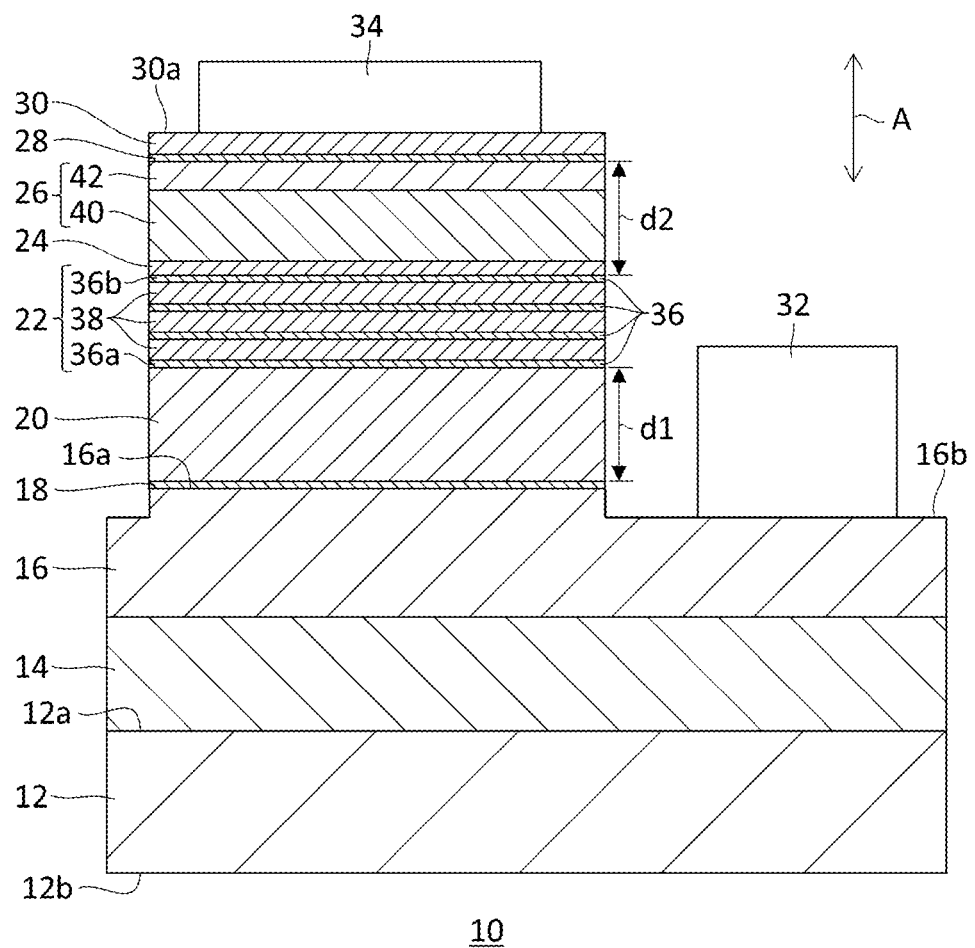

SEMICONDUCTOR LIGHT-EMITTING ELEMENT

RELATED APPLICATION

Priority is claimed to Japanese Patent Application No. 2021-069026, filed on Apr. 15, 2021, the entire content of which is incorporated herein by reference.

BACKGROUND OF THE INVENTION

1. Field of the Invention

The present invention relates to semiconductor light-emitting elements.

2. Description of the Related Art

A semiconductor light-emitting element includes an n-type semiconductor layer, a light-emitting layer, and a p-type semiconductor layer stacked on a substrate. A configuration is known in which a first ESD countermeasure layer and a second ESD countermeasure layer are inserted between the n-type semiconductor layer and the light-emitting layer to increase the electrostatic withstand voltage (ESD withstand voltage) of the semiconductor light-emitting element, wherein the first ESD countermeasure layer includes stacked layers having different n-type impurity concentrations, and the second ESD countermeasure layer includes an undoped superlattice structure (see, for example, JP2013-183126).

Provision of the first ESD countermeasure layer and the second ESD countermeasure layer makes the element structure complicated and extends the crystal growth time. It is preferred that the ESD withstand voltage be improved with a simpler configuration.

SUMMARY OF THE INVENTION

The present invention addresses the above-described issue, and a purpose thereof is to provide a semiconductor light-emitting element in which the ESD withstand voltage can be improved with a simpler configuration.

A semiconductor light-emitting element according to an embodiment of the present invention includes: an n-type contact layer made of an n-type AlGaN-based semiconductor material; an n-side inserted layer provided on a first upper surface of the n-type contact layer, made of an AlGaN-based semiconductor material, and having a thickness equal to or smaller than 5 nm; an n-type clad layer provided on the n-side inserted layer and made of an n-type AlGaN-based semiconductor material; an active layer provided on the n-type clad layer and including a well layer and a barrier layer made of an AlGaN-based semiconductor material; a p-type clad layer provided on the active layer and made of a p-type AlGaN-based semiconductor material; a p-side inserted layer provided on the p-type clad layer, made of an AlGaN-based semiconductor material, and having a thickness equal to or smaller than 5 nm; and a p-type contact layer provided on the p-side inserted layer and made of a p-type AlGaN-based semiconductor material. An AlN composition of each of the n-side inserted layer and the p-side inserted layer is higher than an AlN composition of the barrier layer.

BRIEF DESCRIPTION OF THE DRAWINGS

The FIGURE is a cross sectional view schematically showing a configuration of a semiconductor light-emitting element according to an embodiment.

DETAILED DESCRIPTION OF THE INVENTION

The invention will now be described by reference to the preferred embodiments. This does not intend to limit the scope of the present invention, but to exemplify the invention.

A detailed description will be given of embodiments of the present invention with reference to the drawings. The same numerals are used in the description to denote the same elements, and a duplicate description is omitted as appropriate. To facilitate the understanding, the relative dimensions of the constituting elements in the drawings do not necessarily mirror the relative dimensions in the actual light-emitting element.

The semiconductor light-emitting element according to the embodiment is configured to emit "deep ultraviolet light" having a central wavelength λ of about 360 nm or shorter and is a so-called deep ultraviolet light-emitting diode (UV-LED) chip. To output deep ultraviolet light having such a wavelength, an aluminum gallium nitride (AlGaN)-based semiconductor material having a band gap of about 3.4 eV or larger is used. The embodiment particularly shows a case of emitting deep ultraviolet light having a central wavelength λ of about 240 nm-320 nm.

In this specification, the term "AlGaN-based semiconductor material" refers to a semiconductor material containing at least aluminum nitride (AlN) and gallium nitride (GaN) and shall encompass a semiconductor material containing other materials such as indium nitride (InN). Therefore, "AlGaN-based semiconductor materials" as recited in this specification can be represented by a composition $In_{1-x-y}Al_xGa_yN$ ($0<x+y\leq1$, $0<x<1$, $0<y<1$). The AlGaN-based semiconductor material shall encompass AlGaN or InAlGaN.

The FIGURE is a cross sectional view schematically showing a configuration of a semiconductor light-emitting element 10 according to an embodiment. The semiconductor light-emitting element 10 includes a substrate 12, a base layer 14, an n-type contact layer 16, an n-side inserted layer 18, an n-type clad layer 20, an active layer 22, an electron blocking layer 24, a p-type clad layer 26, a p-side inserted layer 28, a p-type contact layer 30, an n-side contact electrode 32, and a p-side contact electrode 34.

Referring to the FIGURE, the direction indicated by the arrow A may be referred to as "vertical direction" or "direction of thickness". In a view of the substrate 12, the direction away from the substrate 12 may be referred to as upward, and the direction toward the substrate 12 may be referred to as downward.

The substrate 12 includes a first principal surface 12a and a second principal surface 12b opposite to the first principal surface 12a. The first principal surface 12a is a crystal growth surface for growing the layers from the base layer 14 to the p-type contact layer 30. The substrate 12 is made of a material having translucency for the deep ultraviolet light emitted by the semiconductor light-emitting element 10 and is made of, for example, sapphire ($Al_2O_3$). The second principal surface 12b is a light extraction substrate for extracting the deep ultraviolet light emitted by the active layer 22 outside. The substrate 12 may be made of AlN or made of AlGaN.

The base layer 14 is provided on the first principal surface 12a of the substrate 12. The base layer 14 is a foundation layer (template layer) to form the n-type contact layer 16. The base layer 14 is made of an undoped AlGaN-based semiconductor material and includes, for example, an undoped AlN layer and an undoped AlGaN layer provided on the AlN layer. The base layer 14 may be comprised only of an undoped AlGaN layer when the substrate 12 is an AlN substrate or an AlGaN substrate.

The n-type contact layer 16 is provided on the base layer 14. The n-type contact layer 16 is made of an n-type AlGaN-based semiconductor material and is doped with, for example, Si as an n-type impurity. The n-type contact layer 16 is made of, for example, n-type AlGaN having an AlN composition of 25% or higher, 40% or higher, or 50% or higher. The n-type contact layer 16 is made of, for example, n-type AlGaN having an AlN composition of 80% or lower or 70% or lower. The n-type contact layer 16 has, for example, a thickness equal to or more than 1 µm and equal to or less than 3 µm.

The n-side inserted layer 18 is provided on a first upper surface 16a of the n-type contact layer 16. The n-side inserted layer 18 is provided between the n-type contact layer 16 and the n-type clad layer 20. The n-side inserted layer 18 is made of an undoped or n-type AlGaN-based semiconductor material. The n-side inserted layer 18 has an AlN composition higher than the AlN composition of the n-type contact layer 16 and the n-type clad layer 20. The n-side inserted layer 18 may have an AlN composition higher than the AlN composition of a barrier layer 38 included in the active layer 22. The AlN composition of the n-side inserted layer 18 is, for example, 80% or higher or 90% or higher. The n-side inserted layer 18 may be made of AlN. The n-side inserted layer 18 has a thickness equal to or smaller than 5 nm and has, for example, a thickness equal to or more than 1 nm and equal to or less than 3 nm.

The n-type clad layer 20 is provided on the n-side inserted layer 18. The n-type clad layer 20 is made of an n-type AlGaN-based semiconductor material and is doped with Si as an n-type impurity. The n-type clad layer 20 has an AlN composition equal to the AlN composition of the n-type contact layer 16 or higher than the AlN composition of the n-type contact layer 16. The AlN composition of the n-type contact layer 16 is 25% or higher, 40% or higher, or 50% or higher. The AlN composition of the n-type contact layer 16 is 80% or lower or 70% or lower. The n-type clad layer 20 has a thickness equal to or more than 50 nm and equal to or less than 100 nm. The thickness of the n-type clad layer 20 may be larger than the thickness of the active layer 22.

The active layer 22 is provided on the n-type clad layer 20. The active layer 22 has a monolayer or multilayer quantum well structure. The active layer 22 includes a well layer 36 made of an undoped AlGaN-based semiconductor material and a barrier layer 38 made of an undoped AlGaN-based semiconductor material. The well layer 36 has an AlN composition lower than the AlN composition of the n-type clad layer 20 and the p-type clad layer 26. The barrier layer 38 has an AlN composition equal to the AlN composition of the n-type clad layer 20 or the p-type clad layer 26 or higher than the AlN composition of the n-type clad layer 20 and the p-type clad layer 26.

The active layer 22 includes a plurality of well layers 36 and a plurality of barrier layers 38 and has a multiple quantum well structure in which a plurality of well layers 36 and a plurality of barrier layers 38 are alternately stacked. In the illustrated example, the active layer 22 includes four well layers 36 and three barrier layers 38. The number of well layers 36 and barrier layers 38 may be larger or smaller than illustrated. The plurality of well layers 36 include the first well layer 36a closest to the n-type clad layer 20 and the last well layer 36b closest to the p-type clad layer 26. The first well layer 36a is provided in contact with the n-type clad layer 20, and the last well layer 36b is provided in contact with the electron blocking layer 24. Each barrier layer 38 is provided between two adjacent well layers 36. An additional barrier layer 38 may be provided between the first well layer 36a and the n-type clad layer 20. Further, an additional barrier layer 38 may be provided between the last well layer 36b and the electron blocking layer 24.

Each of the well layers 36 has a thickness equal to or more than 1 nm and equal to or less than 10 nm and has, for example, a thickness equal to or more than 2 nm and equal to or less than 5 nm. Each of barrier layers 38 has a thickness equal to or more than 5 nm and equal to or less than 30 nm and has, for example, a thickness equal to or more than 10 nm and equal to or less than 20 nm. The thickness of the active layer 22 as a whole depends on the number of well layers 36 and barrier layers 38 stacked. For example, the thickness of the active layer 22 as a whole is equal to or more than 20 nm and equal to or less than 80 nm, and, for example, equal to or more than 30 nm and equal to or less than 60 nm.

The electron blocking layer 24 is provided on the active layer 22. The electron blocking layer 24 is made of an undoped or p-type AlGaN-based semiconductor material. The electron blocking layer 24 has an AlN composition equal to the AlN composition of the barrier layer 38 or higher than the AlN composition of the barrier layer 38. The AlN composition of the electron blocking layer 24 is, for example, 80% or higher or 90% or higher. The electron blocking layer 24 may be made of AlN. The electron blocking layer 24 has a thickness equal to or more than 1 nm and equal to or less than 10 nm and has, for example, a thickness equal to or more than 2 nm and equal to or less than 5 nm.

The p-type clad layer 26 is provided on the electron blocking layer 24. The p-type clad layer 26 is made of a p-type AlGaN-based semiconductor material and is doped with magnesium (Mg) as a p-type impurity. The p-type clad layer 26 has a thickness equal to or more than 50 nm and equal to or less than 100 nm. The thickness of the p-type clad layer 26 may be larger than the thickness of the active layer 22.

The p-type clad layer 26 may include a first p-type clad layer 40 and a second p-type clad layer 42. The first p-type clad layer 40 is provided in contact with the electron blocking layer 24. The second p-type clad layer 42 is provided in contact with the first p-type clad layer 40 and is provided between the first p-type clad layer 40 and the p-side inserted layer 28.

The first p-type clad layer 40 has an AlN composition equal to the AlN composition of the n-type clad layer 20 or higher than the AlN composition of the n-type clad layer 20. The first p-type clad layer 40 has an AlN composition equal to or higher than 40% and has, for example, an AlN composition equal to or higher than 70% or equal to or higher than 80%. The first p-type clad layer 40 has a thickness equal to or more than 10 nm and equal to or less than 100 nm and has, for example, a thickness equal to or more than 15 nm and equal to or less than 80 nm. The thickness of the first p-type clad layer 40 may be larger than the thickness of the second p-type clad layer 42.

The second p-type clad layer 42 has an AlN composition lower than the AlN composition of the first p-type clad layer 40. The second p-type clad layer 42 has an AlN composition equal to or higher than 25%, equal to or higher than 40%, or equal to higher than 50% and has an AlN composition equal to or lower than 80% or equal to or lower than 70%. The AlN composition of the second p-type clad layer 42 may be within ±10% of the AlN composition of the n-type contact layer 16 or the n-type clad layer 20. The second p-type clad layer 42 has a thickness equal to or more than 5 nm and equal to or less than 50 nm and has, for example, a thickness equal to or more than 10 nm and equal to or less than 30 nm.

The p-side inserted layer 28 is provided on the p-type clad layer 26. The p-side inserted layer 28 is provided between the p-type clad layer 26 and the p-type contact layer 30. The p-side inserted layer 28 is made of an undoped or p-type AlGaN-based semiconductor material. The p-side inserted layer 28 has an AlN composition higher than the AlN composition of the p-type clad layer 26 and the p-type contact layer 30. The p-side inserted layer 28 may have an AlN composition higher than the AlN composition of the barrier layer 38. The AlN composition of the p-side inserted layer 28 is, for example, 80% or higher or 90% or higher. The p-side inserted layer 28 may be made of AlN. The p-side inserted layer 28 has a thickness equal to or smaller than 5 nm and has, for example, a thickness equal to or more than 1 nm and equal to less than 3 nm. The AlN composition and thickness of the p-side inserted layer 28 may be equal to the AlN composition and thickness of the n-side inserted layer 18, respectively.

The n-side inserted layer 18 and the p-side inserted layer 28 may be provided at positions symmetrical in the vertical direction as viewed from the active layer 22. Stated otherwise, the first distance d1 from the active layer 22 to the n-side inserted layer 18 may be substantially equal to the second distance d2 from the active layer 22 to the p-side inserted layer 28. For example, the difference between the first distance d1 and the second distance d2 may be within 10% of the first distance d1 or the second distance d2. When the first distance d1 is 70 nm, for example, the second distance d2 is equal to or more than 63 nm and equal to or less than 77 nm. In an embodiment, the first distance d1 is a distance from the interface between the n-type clad layer 20 and the first well layer 36*a* to the interface between the n-type clad layer 20 and the n-side inserted layer 18 and matches the thickness of the n-type clad layer 20. Further, the second distance d2 is a distance from the interface between the electron blocking layer 24 and the last well layer 36*b* to the interface between the p-type clad layer 26 and the p-side inserted layer 28 and matches the total thickness of the electron blocking layer 24 and the p-type clad layer 26. It is preferred that the first distance d1 and the second distance d2 are larger than the thickness of the active layer 22. It is preferred that the first distance d1 and the second distance d2 are equal to or smaller than 100 nm.

The p-type contact layer 30 is provided on the p-side inserted layer 28. The p-type contact layer 30 is made of a p-type AlGaN-based semiconductor material. The p-type contact layer 30 has an AlN composition lower than the AlN composition of the p-type clad layer 26. The p-type contact layer 30 has an AlN composition equal to or lower than 20%, equal to or lower than 10%, or equal to lower than 5%. The p-type contact layer 30 may have an AlN composition of 0% and may be made of p-type GaN. The p-type contact layer 30 has a thickness equal to or more than 1 nm and equal to or less than 30 nm and has, for example, a thickness equal or more than 5 nm and equal to or less than 20 nm.

The n-side contact electrode 32 is provided on a second upper surface 16*b* of the n-type contact layer 16. The n-side contact electrode 32 is in ohmic contact with the n-type contact layer 16. The n-side contact electrode 32 includes, for example, a Ti layer in contact with the n-type contact layer 16 and an Al layer provided on the Ti layer. The n-side contact electrode 32 may further include a Ti layer, an Ni layer, an Rh layer, an Au layer, etc. provided on the Al layer.

The p-side contact electrode 34 is provided on an upper surface 30*a* of the p-type contact layer 30. The p-side contact electrode 34 is in ohmic contact with the p-type contact layer 30. The p-side contact electrode 34 includes, for example, an Rh layer in contact with the p-type clad layer 26 and an Al layer provided on the Rh layer. The p-side contact electrode 34 may further include a Ti layer, an Ni layer, an Rh layer, an Au layer, etc. provided on the Al layer.

According to the embodiment, the ESD withstand voltage of the semiconductor light-emitting element 10 can be improved by providing the n-side inserted layer 18 and the p-side inserted layer 28. In the case of the element structure of horizontal type as shown in the FIG. 1, the current and the electric field tend to be concentrated at the ends of the n-side contact electrode 32 and the p-side contact electrode 34, and a large electric field is created locally so that ESD destruction occurs easily. According to the embodiment, provision of the n-side inserted layer and the p-side inserted layer 28 having an AlN composition higher than the AlN composition of the barrier layer 38 causes the current to be diffused in the horizontal direction in the n-side inserted layer 18 and the p-side inserted layer 28 having a high resistance and mitigates local concentration of the current and the electric field in the active layer 22. As a result, the ESD withstand voltage of the semiconductor light-emitting element 10 can be improved as compared with the case in which the n-side inserted layer 18 and the p-side inserted layer 28 are not provided.

According to the embodiment, local current concentration in the active layer 22 can be mitigated by providing the n-side inserted layer 18 and the p-side inserted layer 28 so that a larger driving current can be supplied to the semiconductor light-emitting element 10. As a result, the light emitting efficiency of the semiconductor light-emitting element 10 can be increased.

According to the embodiment, the effect of mitigating current concentration in the lower part (n-side) and the upper part (p-side) of the active layer 22 is uniformized by configuring the first distance d1 from the active layer 22 to the n-side inserted layer 18 and the second distance d2 from the active layer 22 to the p-side inserted layer 28 to be substantially equal. For example, the horizontal current concentration distribution in the first well layer 36*a* and the horizontal current concentration distribution in the last well layer 36*b* can be made equal, and local current concentration in the active layer 22 can be mitigated more suitably.

According to the embodiment, current concentration in the active layer 22 can be mitigated more suitably by configuring the first distance d1 from the active layer 22 to the n-side inserted layer 18 and the second distance d2 from the active layer 22 to the p-side inserted layer 28 to be larger than the thickness of the active layer 22. If the first distance d1 and the second distance d2 are smaller than the thickness of the active layer 22, the distance for diffusing the current in the horizontal direction will be insufficient, and the effect of mitigating current concentration could be reduced.

According to the embodiment, it is possible to prevent the crystal growth time from becoming longer while, at the same time, securing the effect of mitigating current concentration, by configuring the first distance d1 from the active layer 22 to the n-side inserted layer 18 and the second distance d2 from the active layer 22 to the p-side inserted layer 28 to be equal to or smaller than 100 nm. Further, the series resistance component is inhibited from increasing due to an increase in the thickness of the p-type clad layer 26 so that the effect of mitigating current concentration is further enhanced.

The present invention has been described based on embodiments. The present invention is not limited to the embodiments described above, and it will be understood by those skilled in the art that various design changes are possible and various modifications are possible and that such modifications are also within the scope of the present invention.

A description will now be given of some aspects of the present invention.

A first aspect of the present invention relates to a semiconductor light-emitting element including: an n-type contact layer made of an n-type AlGaN-based semiconductor material; an n-side inserted layer provided on a first upper surface of the n-type contact layer, made of an AlGaN-based semiconductor material, and having a thickness equal to or smaller than 5 nm; an n-type clad layer provided on the n-side inserted layer and made of an n-type AlGaN-based semiconductor material; an active layer provided on the n-type clad layer and including a well layer and a barrier layer made of an AlGaN-based semiconductor material; a p-type clad layer provided on the active layer and made of a p-type AlGaN-based semiconductor material; a p-side inserted layer provided on the p-type clad layer, made of an AlGaN-based semiconductor material, and having a thickness equal to or smaller than 5 nm; and a p-type contact layer provided on the p-side inserted layer and made of a p-type AlGaN-based semiconductor material, wherein an AlN composition of each of the n-side inserted layer and the p-side inserted layer is higher than an AlN composition of the barrier layer. According to the first aspect, the ESD withstand capability of the semiconductor light-emitting element can be improved with a simple structure in which the n-side inserted layer and the p-side inserted layer having an AlN composition higher than the AlN composition of the barrier layer are provided.

The second aspect of the present invention relates to the semiconductor light-emitting element according to the first aspect, wherein the active layer has a multiple quantum well structure in which a plurality of well layers and a plurality of barrier layers are alternately stacked, a difference between a first distance and a second distance is equal to or smaller than 10% of the first distance or the second distance, wherein the first distance is a distance from a first well layer, of the plurality of well layers, closest to the n-type clad layer to the n-side inserted layer, and the second distance is a distance from a last well layer, of the plurality of well layers, closest to the p-type clad layer to the p-side inserted layer. According to the second aspect, it is ensured that the effect of mitigating current concentration in the first well layer and the effect of mitigating current concentration in the last well layer are substantially equal by configuring the difference between the first distance d1 and the second distance d2 to be within 10% of the first distance or the second distance and then ensuring that the first distance and the second distance are substantially equal.

The third aspect of the present invention relates to the semiconductor light-emitting element according to the second aspect wherein each of the first distance and the second distance is larger than a thickness of the active layer. According to the third aspect, the distance for diffusing the current in the horizontal direction is sufficiently ensured, and local current concentration in the active layer is suitably inhibited, by configuring each of the first distance and the second distance to be larger than the thickness of the active layer.

The fourth aspect of the present invention relates to the semiconductor light-emitting element according to the second aspect or the third aspect, wherein each of the first distance and the second distance is equal to or smaller than 100 nm. According to the fourth aspect, it is possible to prevent the crystal growth time from becoming longer while, at the same time, securing the effect of mitigating current concentration.

The fifth aspect of the present invention relates to the semiconductor light-emitting according to one of the first to fourth aspects, wherein at least one of the n-side inserted layer and the p-side inserted layer is undoped. According to the fifth aspect, the effect of mitigating current concentration can be enhanced by configuring the n-side inserted layer and the p-side inserted layer to be undoped to have a high resistance.

The sixth aspect relates to the semiconductor light-emitting element according to one of the first to fifth aspects, wherein at least one of the n-side inserted layer and the p-side inserted layer is made of AlN. According to the sixth aspect, the effect of mitigating current concentration can be enhanced by configuring the n-side inserted layer and the p-side inserted layer to be an AlN layer to have a high resistance.

What is claimed is:

1. A semiconductor light-emitting element comprising:
    an n-type contact layer made of an n-type AlGaN-based semiconductor material;
    an n-side inserted layer provided on a first upper surface of the n-type contact layer, made of an AlGaN-based semiconductor material, and having a thickness equal to or smaller than 5 nm;
    an n-type clad layer provided on the n-side inserted layer and made of an n-type AlGaN-based semiconductor material;
    an active layer provided on the n-type clad layer and including a well layer and a barrier layer made of an AlGaN-based semiconductor material;
    a p-type clad layer provided on the active layer and made of a p-type AlGaN-based semiconductor material;
    a p-side inserted layer provided on the p-type clad layer, made of an AlGaN-based semiconductor material, and having a thickness equal to or smaller than 5 nm; and
    a p-type contact layer provided on the p-side inserted layer and made of a p-type AlGaN-based semiconductor material, wherein
    an AlN composition of each of the n-side inserted layer and the p-side inserted layer is higher than an AlN composition of the barrier layer.

2. The semiconductor light-emitting element according to claim 1, wherein
    the active layer has a multiple quantum well structure in which a plurality of well layers and a plurality of barrier layers are alternately stacked,
    a difference between a first distance and a second distance is equal to or smaller than 10% of the first distance or the second distance, wherein the first distance is a distance from a first well layer, of the plurality of well layers, closest to the n-type clad layer to the n-side inserted layer, and the second distance is a distance from a last well layer, of the plurality of well layers, closest to the p-type clad layer to the p-side inserted layer.

3. The semiconductor light-emitting element according to claim 2, wherein
each of the first distance and the second distance is larger than a thickness of the active layer.

4. The semiconductor light-emitting element according to claim 2, wherein
each of the first distance and the second distance is equal to or smaller than 100 nm.

5. The semiconductor light-emitting element according to claim 1, wherein
at least one of the n-side inserted layer and the p-side inserted layer is undoped.

6. The semiconductor light-emitting element according to claim 1, wherein
at least one of the n-side inserted layer and the p-side inserted layer is made of AlN.

\* \* \* \* \*